United States Patent [19]
Dobrovolny

[11] Patent Number: 6,133,965
[45] Date of Patent: Oct. 17, 2000

[54] DIGITAL AGC CONTROL FOR HIGH DEFINITION TELEVISION TUNER

[75] Inventor: Pierre Dobrovolny, North Riverside, Ill.

[73] Assignee: Zenith Electronics Corporation, Glenview, Ill.

[21] Appl. No.: 09/023,153

[22] Filed: Feb. 12, 1998

[51] Int. Cl.[7] .................................................. H04N 5/50
[52] U.S. Cl. ......................... 348/731; 348/733; 348/678
[58] Field of Search ................................... 348/731, 735, 348/733, 720, 678; 455/182.1

[56] References Cited

U.S. PATENT DOCUMENTS

| | | | |
|---|---|---|---|
| 5,125,106 | 6/1992 | Kato | 455/182.1 |
| 5,546,138 | 8/1996 | Krishnamurthy et al. | 348/735 |
| 5,565,932 | 10/1996 | Citta et al. | 348/678 |
| 5,761,210 | 6/1998 | Claydon et al. | 371/2.1 |
| 5,818,544 | 10/1998 | Han | 348/731 |
| 5,953,636 | 9/1999 | Keate et al. | 455/3.2 |
| 5,987,074 | 11/1999 | Wakamatsu | 348/731 |
| 6,014,547 | 1/2000 | Caporizzo et al. | 348/731 |

Primary Examiner—Victor R. Kostak

[57] ABSTRACT

A high definition television tuner includes a frequency compensated PI type PIN diode attenuator with the current through the series diode controlled separately from the current through the shunt diodes. A look-up table contains information that correlates the selected RF frequency and the desired AGC level with input data for two D/A converters. A microprocessor controls the D/A digital data, which is based upon information provided by a digital signal processing circuit. In one embodiment of the invention, the look-up table is connected between a D/A converter and a microprocessor and the microprocessor controls the look-up table for supplying the digital data to the D/A converters. In another embodiment, the microprocessor, after receiving the desired AGC level information, first interrogates the look-up table, then supplies the digital data to the D/A converter based.

14 Claims, 3 Drawing Sheets

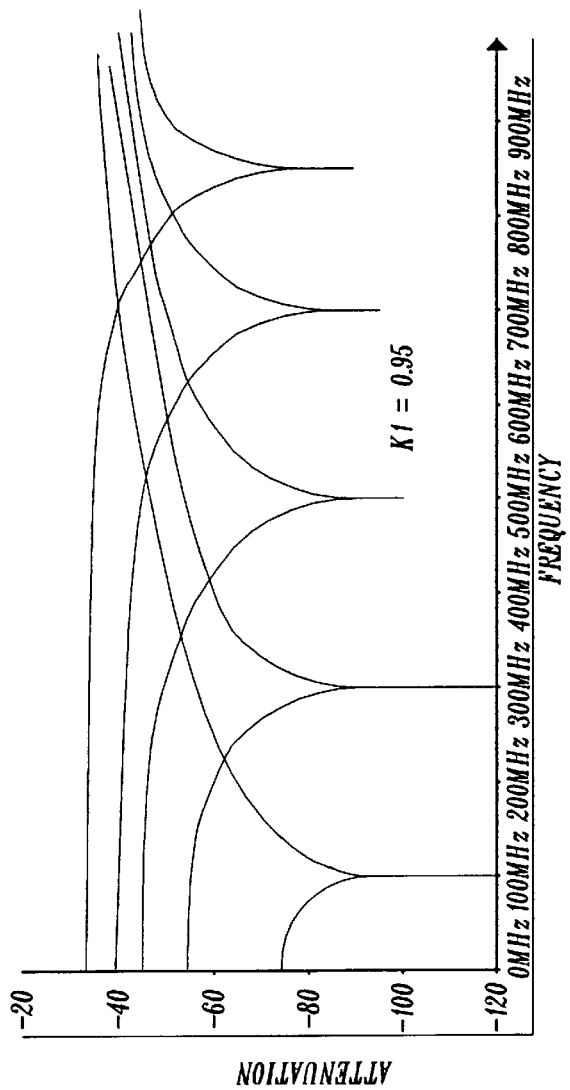
FIG. 5
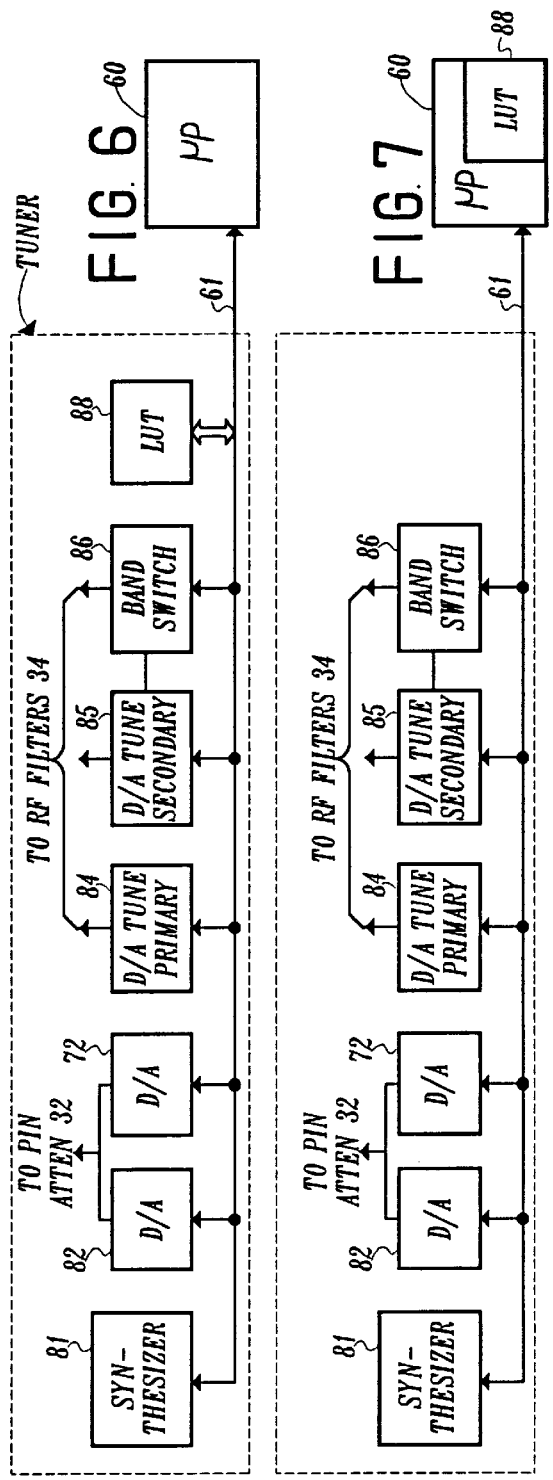
FIG. 6
FIG. 7

DIGITAL AGC CONTROL FOR HIGH DEFINITION TELEVISION TUNER

BACKGROUND OF THE INVENTION AND PRIOR ART

This invention relates generally to television receiver tuners and specifically to television receiver tuners for use in digital high definition television receivers.

High definition television receivers will very likely incorporate double conversion tuners in which the input RF signal is upconverted to a very high frequency (on the order of 1 GHz or more), filtered and downconverted to a standard 44 MHz IF frequency. Ideally, the frequency response characteristic of the tuner is substantially flat over the tuned frequency band. While the ideal is seldom attainable, various adjustments to the gain characteristics of the RF section of the tuner can help to provide the best compromise between protection from undesired signals and noise. Presently available wideband AGC circuits do not have the desired range of attenuation and precision for such tuners and the present invention is directed to making a precisely controllable AGC circuit for a high definition television tuner.

OBJECTS OF THE INVENTION

A principal object of the invention is to provide a novel high definition television tuner.

Another object of the invention is to provide an improved AGC control circuit for a digital high definition television tuner.

A further object of the invention is to provide a microprocessor-controlled digital AGC system for a high definition television receiver.

BRIEF DESCRIPTION OF THE DRAWINGS

These and other objects and advantages of the invention will be apparent upon reading the following description thereof in conjunction with the drawings, in which:

FIG. 5 is a theoretical simulation of maximum attainable AGC attenuation over the frequency band;

FIG. 6 is a block diagram of a tuner that includes another version of the invention; and FIG. 7 is a modification of the tuner of FIG. 6.

DESCRIPTION OF THE PREFERRED EMBODIMENT

Figure 1:
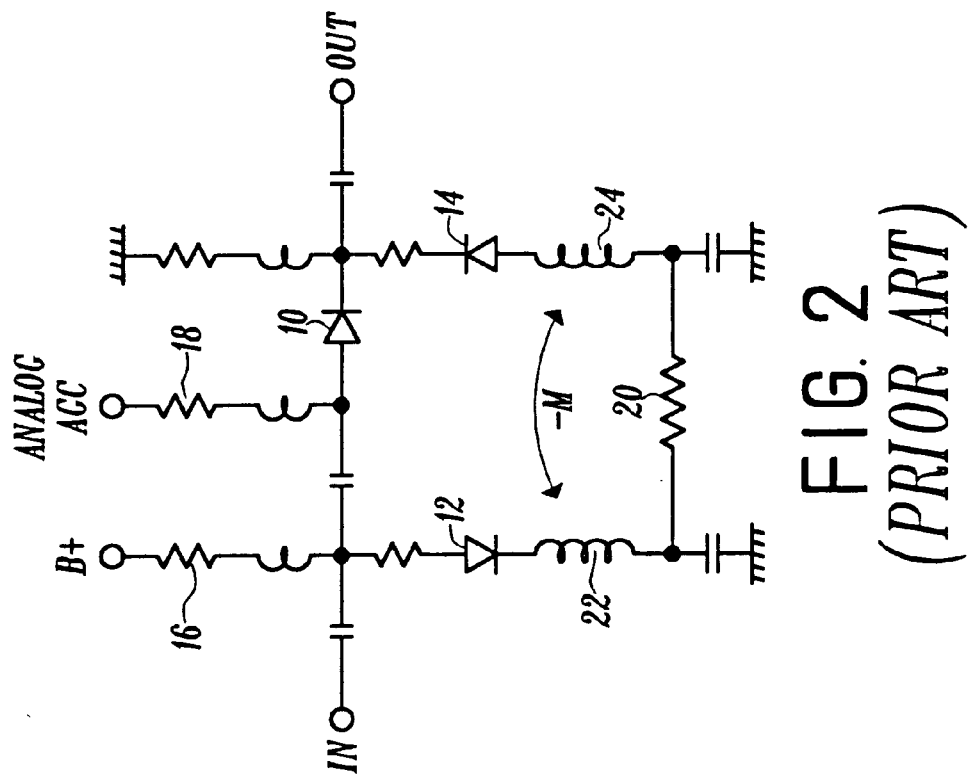
FIG. 1 is a partial schematic diagram of a prior art AGC controlled PIN diode attenuator for the RF stage of a television tuner.

Referring to FIG. 1, a PIN diode attenuator network includes three PIN diodes 10, 12, and 14 that are arranged in a Pi configuration. A fixed DC bias is applied to PIN diode 12 through a resistor 16 that is connected to a source of B+ potential. Series connected PIN diode 10 is supplied with a variable analog AGC voltage. PIN diodes 12 and 14 are connected in series through a resistor 20. This prior art circuit exhibits a relatively small AGC range (on the order of 20 dB maximum) at the high end of the RF frequency band, has considerable tilt and its attenuation decreases with increasing frequency and AGC voltage when operated in the 50 to 800 MHz frequency range.

Figure 2:
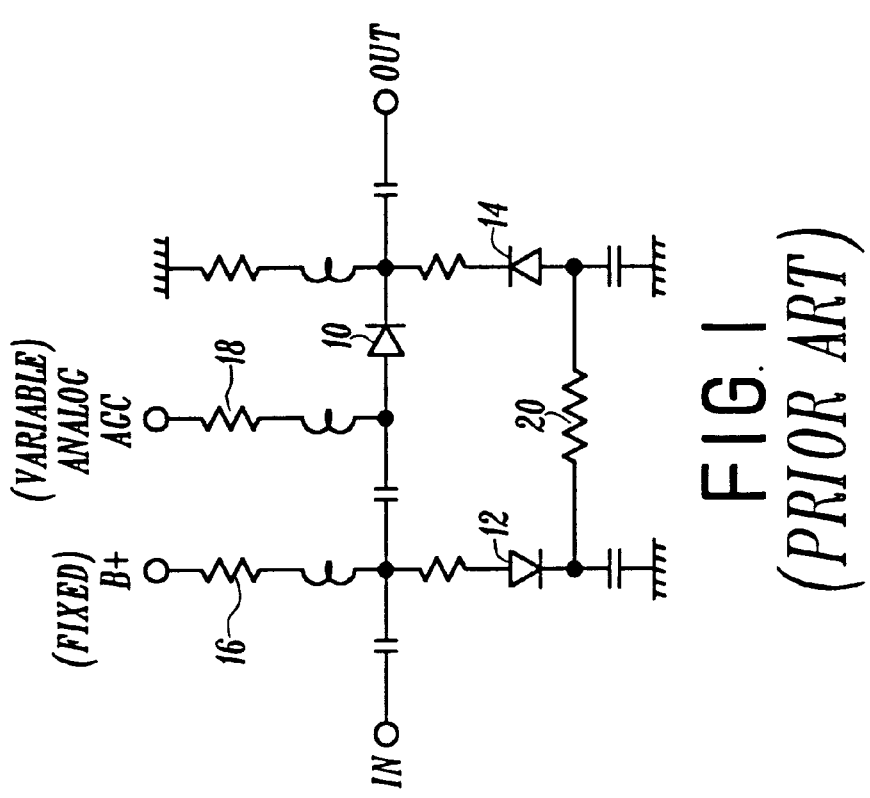
FIG. 2 is a partial schematic diagram of an improved prior art AGC controlled compensated PIN diode RF attenuator.

The FIG. 2 prior art circuit improved on the performance of the circuit of FIG. 1 by introducing a pair of inductors 22 and 24, comprising very short transmission line sections, arranged to have a negative mutual coupling (−M) for compensating the parasitic capacitance of PIN diode 10. These compensating elements resulted in an increased AGC range (on the order of 30 to 40 dB) at higher frequencies and therefore the circuit exhibited much less tilt. The arrangement of resistor 16 connected to a fixed DC source and resistor 18 connected to a variable AGC voltage was retained.

Figure 3:
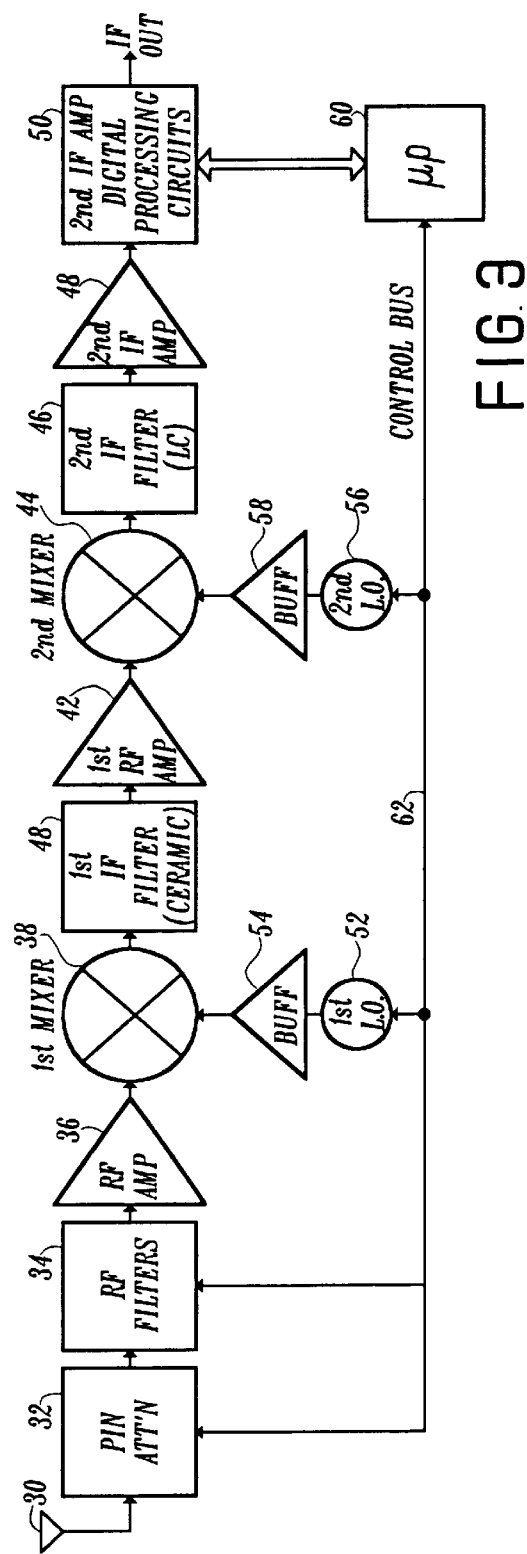
FIG. 3 is a simplified block diagram example of a television tuner having an RF stage that is AGC controlled in accordance with the present invention.

Referring now to the embodiment of FIG. 3, a tuner, constructed in accordance with the invention, is partially illustrated in block form An antenna (or cable) 30 supplies an RF PIN diode attenuator 32 that couples the received RF signals to (varactor diode controlled) RF filters 34 which, in turn, couple the signal through an amplifier 36 to the input of a first mixer circuit 38, the other input of which is supplied from a first local oscillator 52 through a buffer amplifier 54. The output of first mixer 38 is coupled to a first IF amplifier 42 that is protected by a (preferably) ceramic first IF filter 40 which produces an IF output signal of 920 MHz. The first IF output signal is supplied to the input port of a second mixer 44, the local oscillator (LO) port of which is driven from a second local oscillator 56 through a buffer amplifier 58. The output of second mixer 44 is a second IF (44 MHz center) signal that is applied to a second IF filter 46 (LC type) and then through a second IF amplifier 48. The IF signal is supplied to a digital processing block 50 which is controlled by microprocessor 60. Digital processing block 50 provides periodically updated information about the received signal level to a microprocessor 60. Microprocessor 60 is coupled to PIN diode attenuator 32, RF filters 34, first and second local oscillators 52 and 56 by means of a control bus 62 over which the various components may be individually addressed and controlled in a well-known manner.

Figure 4:
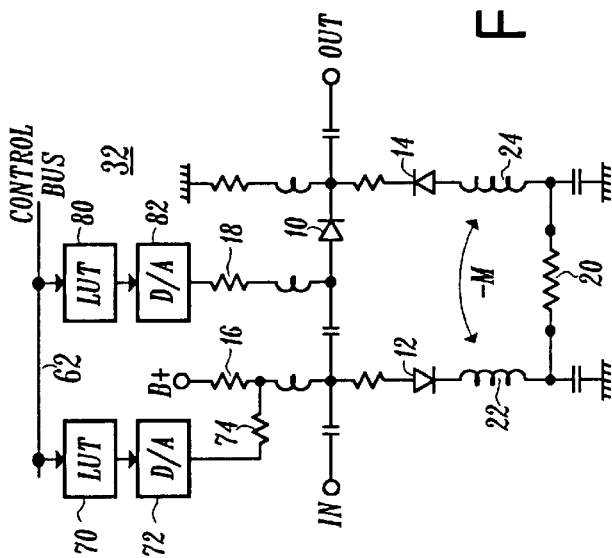
FIG. 4 is a partial schematic diagram of the digitally controlled wideband RF AGC hardware of the invention.

FIG. 4 shows PIN diode attenuator 32 in detail. It will be seen that the PIN diode arrangement is nearly identical to the prior art circuit shown in FIG. 2. Resistor 16 is still connected to a fixed B+ voltage to provide a fixed biasing current. In addition to the fixed bias current, an additional current is superimposed by a resistor 74 that is connected to a D/A 72 that, in turn, is coupled to a look-up table (LUT) 70 that is in communication with the control bus 62. The main AGC voltage is supplied to resistor 18 from a D/A 82 that is coupled to a look-up table 80, which is also in communication with control bus 62. In this manner, a large RF attenuation range may be obtained within a reasonably narrow frequency range. In practice attenuation of 50 to 60 dB, in conjunction with the varactor tuned RF filters 34 and first IF filter 40, is probably sufficient to provide ample protection for a digital television tuner.

The AGC within a robust double conversion tuner with a gain of 30 to 40 dB and with some type of tunable selectivity in front serves dual purposes. The first is to protect all active circuits within the tuner itself The second is to provide the necessary attenuation range so that the IF AGC is not reactivated after the tuner AGC has reached its saturation point. Considering that the highest practical broadcast signal levels may be around −10 dB, an AGC range of about 20 dB should be sufficient for the protection of a state-of-the-art upconverting portion of the tuner where the gain at the output of the RF amplifier and input of the mixer is about 10 dB. The downconverter portion of the tuner, which provides most of the tuner gain and which has fixed narrow band selective protection (provided by first IF filter 40), requires an additional AGC range which is provided in the vicinity of the selected desired frequency.

This is illustrated in FIG. 5, which comprises a theoretical simulation of the frequency-dependent AGC attenuation response with the shunt and series resistances of the corresponding PIN diodes individually adjusted for an infinite attenuation at any desired frequency. While a total range of 60 dB may be considered practical, from FIG. 5 it is evident that the broadband attenuation will always be larger than 30 dB. Therefore ample protection for the upconverting portion of the double conversion tuner is provided.

For small and medium attenuation (0 to 30 dB), the inventive arrangement of FIG. 3 and FIG. 4 operates in the same way and has the same RF performance as the prior art arrangement of FIG. 2 except that the AGC control signal is delivered in digital form and converted by the D/A 82 into the main analog AGC control signal for steering all three of the PIN diodes 10, 12 and 14. For small attenuations, microprocessor 60 sets LUT 70 (via control bus 62) to apply a fixed value to D/A 72. For attenuations over 30 dB, the PIN diodes are subjected to more precise control. For such attenuations, microprocessor 60 actively controls both D/As 70 and 72 over control bus 62. Specifically LUTs 72 and 82 contain the necessary tuning frequency and AGC related data to enable the currents through resistors 16 and 8 to be individually controlled to maintain the desired degree of attenuation at the desired frequency points over the AGC range.

The above-described arrangement provides a precise digital tuner AGC control. By using the LUTs, the optimum digital values of AGC voltage is applied to the PIN diode attenuator (RF stage) for the tuned frequency of the tuner. These values are determined in advance and accessed via the microprocessor. The embodiment illustrated in FIGS. 3 and 4 has digital control signals delivered to the LUT by means of a serial bus while the interfacing between the LUTs and the associated D/As is accomplished by a parallel bus connection. This requires an appropriate serial interface for each LUT. The LUT itself may reside in an electrically erasable memory (EEPROM), that in turn may reside in the tuner. Each tuner EEPROM may be provided with precise AGC data (during the tuner alignment procedure) that reflected the individual tuner component variations. Since there is another EEPROM in the tuner that contains information necessary to store data for the tuning of the RF filters 34, the tuning and AGC data may advantageously be combined in a single EEPROM. This is illustrated in the version of FIG. 6.

In the FIG. 6 tuner, the microprocessor is in communication with a plurality of functional elements via a serial bus 61. Upon the input of a channel number, a synthesizer 81 is set by the microprocessor for tuning the tuner to the corresponding frequency. Microprocessor 60 interrogates a look-up table 88 that includes the necessary data for tuning based upon the selected frequency. The data is provided to the microprocessor which first sets the switching and tuning of RF filters 34 and then sets the D/As 72 and 82 for controlling the PIN diode attenuator 32. It is also contemplated that all of the D/A and bandswitching functions illustrated in FIG. 6 may be combined into a single integrated circuit chip that has a standard serial input, three digital inputs and about four analog outputs.

A less costly version of the invention results from moving LUT 88 out of the tuner into the microprocessor, as illustrated in FIG. 7. The difficulty is that in this version every tuner would require a unique set of data stored outside the tuner for tuning and for AGC. The advantage of the FIG. 6 and FIG. 7 versions over the FIG. 3 version is that less EEPROM memory is required. This is because the microprocessor has an arithmetic capability which enables it to interpolate when using a coarse set of stored data. The combined action of the two resulting voltages applied to PIN diode attenuator 32 can produce a very closely controlled frequency response for the tuner over the tuning range.

What has been described is a novel digital AGC control circuit for a high definition television receiver tuner. It is recognized that numerous changes in the described embodiment of the invention will be apparent to those skilled in the art without departing from its true spirit and scope. The invention is to be limited only as defined in the claims.

What is claimed is:

1. A method of operating a digital television tuner having an RF stage including a Pi configuration attenuator comprising:

providing an AGC circuit for developing a fixed and a variable analog control voltage for application to the Pi configuration attenuator for controlling the gain of the RF stage;

providing a look-up table that correlates preselected values of the fixed analog control voltage with different tuning frequencies of the television tuner; and using a D/A converter for converting digital data from the look-up table to the preselected values of the fixed analog control voltage, at the different tuning frequencies, for the Pi configuration attenuator.

2. The method of claim 1, further comprising:

providing that the digital data from the look-up table correlates preselected values of both the fixed and the variable analog control voltages with different tuning frequencies; and converting the digital data from the look-up table to the preselected values for both the fixed and the variable analog control voltages, at the different tuning frequencies, for the Pi configuration attenuator.

3. The method of claim 2, further comprising using a microprocessor for controlling the digital data.

4. The method of claim 3, further comprising using the microprocessor to control the look-up table for supplying the digital data.

5. The method of claim 3, further comprising using the microprocessor for obtaining information from the look-up table for developing the digital data.

6. A method of operating a digital television tuner having an RF stage including a PIN diode attenuator comprising:

providing an AGC circuit for developing a fixed and a variable analog control voltage for application to the PIN diode attenuator for controlling the gain of the RF stage;

providing a look-up table that correlates preselected values of the fixed and the variable analog control voltages with different tuning frequencies; and using a D/A converter for converting digital data from the look-up table to the preselected values of both the fixed and variable analog control voltages, at the different tuning frequencies, for the PIN diode attenuator.

7. A digital television tuner including an RF stage and a Pi configuration attenuator comprising:

an AGC circuit for developing a fixed and a variable analog control voltage for application to said Pi configuration attenuator for controlling the gain of said RF stage;

a look-up table for providing digital data correlated with preselected values of said fixed analog control voltage at different tuning frequencies; and D/A converter means for converting said digital data from said look-up table to said preselected values of said fixed analog control voltage, at the different tuning frequencies, for said Pi configuration attenuator.

8. The tuner of claim 7, wherein said digital data from said look-up table also includes preselected values of said variable analog control voltage at said different tuning frequencies; and wherein said D/A converter means converts said digital data from said look-up table to said preselected values of both said fixed and said variable analog control voltages, at said different tuning frequencies, for said Pi configuration attenuator.

9. The tuner of claim 8, further comprising microprocessor means for controlling said digital data.

10. The tuner of claim 9, wherein said look-up table is coupled between said D/A converter means and said microprocessor means whereby said microprocessor means controls said look-up table for supplying said digital data.

11. The tuner of claim 9, wherein said microprocessor means is coupled to said look-up table and to said D/A converter means whereby said microprocessor means supplies said D/A converter means based upon said digital data from said look-up table.

12. A digital television tuner including an RF stage and a PIN diode attenuator comprising:

an AGC circuit for developing a fixed and a variable analog control voltage for application to said PIN diode attenuator for controlling the gain of said RF stage;

a look-up table for providing digital data correlated with preselected values of both said fixed and variable analog control voltages at different tuning frequencies;

D/A converter means for converting said digital data from said look-up table to said preselected values of both said fixed and variable analog control voltages, at said different tuning frequencies, for said PIN diode attenuator; and microprocessor means for controlling said digital data.

13. The tuner of claim 12, wherein said look-up table is coupled between said D/A converter means and said microprocessor means whereby said microprocessor means controls said look-up table for supplying said digital data.

14. The tuner of claim 12, wherein said microprocessor means is coupled to said look-up table and to said D/A converter means whereby said microprocessor means supplies said D/A converter means based upon said digital data from said look-up table.

* * * * *